(12) United States Patent
Arribas et al.

(10) Patent No.: US 11,190,179 B2
(45) Date of Patent: *Nov. 30, 2021

(54) ADVANCED GATE DRIVERS FOR SILICON CARBIDE BIPOLAR JUNCTION TRANSISTORS

(71) Applicant: Software Motor Company, Sunnyvale, CA (US)

(72) Inventors: Alejandro Pozo Arribas, Chicago, IL (US); Mahesh Krishnamurthy, Wheaton, IL (US)

(73) Assignee: Turntide Technologies Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/927,899

(22) Filed: Jul. 13, 2020

(65) Prior Publication Data

US 2020/0403611 A1 Dec. 24, 2020

Related U.S. Application Data

(63) Continuation of application No. 15/990,881, filed on May 29, 2018, now Pat. No. 10,715,135.

(Continued)

(51) Int. Cl.
*H03K 17/60* (2006.01)
*H03K 17/06* (2006.01)
*H03K 17/14* (2006.01)
*H01L 29/08* (2006.01)
*H01L 29/10* (2006.01)
(Continued)

(52) U.S. Cl.
CPC ......... *H03K 17/60* (2013.01); *H01L 29/0804* (2013.01); *H01L 29/0821* (2013.01); *H01L 29/1095* (2013.01); *H01L 29/1608* (2013.01); *H03F 3/2171* (2013.01); *H03K 17/06* (2013.01);
(Continued)

(58) Field of Classification Search
CPC ... H03K 2217/0027; H03K 2217/0036; H03K 2217/0081; H03K 17/60; H03K 17/601–64; H03K 17/14; H03K 17/06; H03K 17/066; H01L 29/0821;
(Continued)

(56) References Cited

U.S. PATENT DOCUMENTS

| 5,107,190 A * | 4/1992 | Schultz | H02M 3/156 315/387 |
| 8,461,818 B1 * | 6/2013 | Benes | H02M 3/158 323/282 |
| 2013/0328505 A1 * | 12/2013 | Sadwick | H05B 39/041 315/307 |

* cited by examiner

*Primary Examiner* — Patrick C Chen
(74) *Attorney, Agent, or Firm* — Temmerman Law; Mathew J. Temmerman

(57) ABSTRACT

A gate driver circuit comprises a sensor, an amplifier, a regulator and a gate driver. The sensor is configured to sense a collector-emitter voltage and includes a first resistor and a second resistor connected in series, a high voltage diode connected between the series connected first and second resistors and a first capacitor connected parallel to the second resistor. The amplifier is configured to amplify a sensor output voltage and includes a non-inverting operational amplifier controlled by means of a plurality of resistors, a voltage follower connected to an output terminal of the non-inverting operational amplifier through a first diode and a third resistor connected across the first diode and the voltage follower. The regulator is configured to regulate a regulator output voltage based on an amplifier voltage. The (Continued)

gate driver is configured to connect/disconnect the regulator output voltage to the base terminal of the BJT.

16 Claims, 6 Drawing Sheets

Related U.S. Application Data

(60) Provisional application No. 62/520,645, filed on Jun. 16, 2017.

(51) Int. Cl.
*H01L 29/16* (2006.01)
*H03F 3/217* (2006.01)

(52) U.S. Cl.
CPC ..... *H03K 17/14* (2013.01); *H03K 2217/0027* (2013.01); *H03K 2217/0036* (2013.01)

(58) Field of Classification Search
CPC ............. H01L 29/0826; H01L 29/0804; H01L 29/0808; H01L 29/0813; H01L 29/0817
See application file for complete search history.

ADVANCED GATE DRIVERS FOR SILICON CARBIDE BIPOLAR JUNCTION TRANSISTORS

RELATED APPLICATIONS

This application is a continuation application of U.S. nonprovisional application Ser. No. 15/990,881, filed May 29, 2018 and granted Jul. 14, 2020 as U.S. patent Ser. No. 10/715,135, and which claims priority from provisional application with Ser. No. 62/520,645 filed on Jun. 16, 2017. The disclosures of these applications are incorporated herein as if set out in full.

BACKGROUND OF THE DISCLOSURE

Technical Field of the Disclosure

This invention relates generally to bipolar junction transistors, and more particularly to an advanced gate driver circuit for silicon carbide (SiC) bipolar junction transistors (BJTs) with minimum power consumption.

Description of the Related Art

Power switching devices have shown drastic developments due to advancements in material science and manufacturing techniques. Among the available power switching devices, Silicon Carbide Bipolar Junction Transistors (SiC BJTs) have the lowest specific on-resistance and operate over a wide range of temperatures with average switching losses. The current gain of SiC BJT is close to 100, which reduces the base current requirement and hence the driver losses. Moreover, the absence of gate-oxide in SiC BJTs makes the technology suitable for high operating temperatures. However, BJTs require continuous base current to maintain their on-state. This, necessitates the need for high power rating drivers which in turn results in higher losses. Moreover, the base current required at high loads can easily compromise the overall efficiency of the switch and the driver at light loads if it is not adjusted properly. Therefore, the base driver is a key component in SiC BJT based converters.

External drive circuits are required to supply the relatively large base currents that are required by high power BJTs. These drive circuits are used to selectively provide a current to the base of the BJT that switches the transistor between ON and OFF states. The base current is determined by the collector current and the DC current gain. However, the collector current varies within each switching period depending on the converter topology and the load. In addition, the current gain is also current and temperature sensitive. Thus, the maximization of the efficiency of the combination of switch and driver becomes a challenging task.

One of the currently available gate drivers provides a Darlington configuration with the SiC BJT which increases the DC current gain beyond 3400. This method reduces the base current requirement to a level where it can be maintained constant regardless of the converter topology, its load and the temperature, all without compromising the efficiency of the switch and the driver. However, it is only recommended for higher voltage applications due to the large total collector-emitter voltage drop. Another gate drive circuit includes an output transistor or a conventional gate driver IC that supplies a constant base current to the switching element regardless of the collector current and temperature. However, this gate drive circuit becomes very inefficient in converters operating in discontinuous conduction mode, inverters, or in any converter where the current flowing through the SiC BJT's is not constant.

Several gate drivers that provide proportional base current are developed to overcome this issue. One such gate driver describes several parallel resistors connected to a voltage supply that generates discretized base current. The base current is then adjusted by enabling the number of resistance branches connected to the base to give the proportional base current. Another approach describes a synchronous buck converter used as gate driver. The regulated output voltage is connected to the base of the BJT to control the amount of base current. Still other methods use a constant voltage source where the base resistance is varied to change the base current. However, all the above methods are based on current measurements which can be a challenge when higher bandwidths are required. Moreover, these methods have a high complexity, due to the current measurement needing to be processed in a digital signal processor (DSP) or a field-programmable gate array (FPGA) to determine the number of branches to be enabled or to calculate the duty cycle of the switches that control the base voltage. Also, some of these drivers use the averaged inductor current for the calculation of the base current, which allows the adjustment of the base current with respect to the variations of the load and not with respect to instantaneous variations of the collector current.

In addition, prior gate drivers do not consider the effect of temperature on the BJT's DC current gain, which decreases with higher temperatures. This forces the driver to always operate the BJT assuming the worst DC current gain, as if the BJT was always operating at the maximum expected temperature. Such approach translates into unnecessary driver power consumption when the actual operating temperature is below the maximum, or in other words, when the DC current gain is not at its minimum.

Therefore, there is a need for an advanced gate driver for silicon carbide (SiC) bipolar junction transistors (BJTs) to provide a proportional base current with minimal power consumption and a method for optimizing the base current of the SiC BJT utilizing the gate driver circuit. Such a gate driver would adjust the base current to the instantaneous collector current by estimating the collector-emitter voltage. Further, such a needed gate driver would monitor the effect of temperature on the DC current gain. Such a gate driver would provide a continuous supply of base current to maintain the BJT in the ON state. Such a gate driver would have minimum power loss during the ON state and minimum switching losses, which increases the efficiency of the driver. Further, such a driver would eliminate the need for the high bandwidth current sensors and the digital signal processors to process collector current of the BJT. The present embodiment overcomes shortcomings in the field by accomplishing these critical objectives.

SUMMARY OF THE DISCLOSURE

To minimize the limitations found in the existing systems and methods, and to minimize other limitations that will be apparent upon the reading of this specification, the preferred embodiment of the present invention provides an advanced gate driver circuit for silicon carbide (SiC) bipolar junction transistors (BJTs) and a method for optimizing the base current of the SiC BJT utilizing the gate driver circuit.

The gate driver circuit comprises a sensor connected between a collector terminal and an emitter terminal of the BJT, an amplifier, a regulator and a gate driver connected to a base terminal of the BJT. The sensor is configured to sense and measure a collector-emitter voltage $V_{CE}$ across the collector terminal and the emitter terminal during the ON state of the BJT. The sensor comprises a first resistor and a second resistor connected in series, a high voltage diode with an anode connected between the series connected first and second resistors and the cathode connected to the collector terminal of the BJT and a first capacitor connected parallel to the second resistor. The sensor can, preferably, be a high voltage decoupling diode. The sensor provides a sensor output voltage $V_m$ based on the measured collector-emitter voltage $V_{CE}$. The amplifier is connected to a sensor output terminal across the first capacitor and is configured to amplify the sensor output voltage $V_m$. The amplifier comprises a non-inverting operational amplifier controlled by means of a plurality of resistors, a voltage follower connected to an output of the non-inverting operational amplifier through a first diode and a third resistor connected across the voltage follower configured to provide the output of the amplifier. The amplifier is selected to provide rail-to-rail operation, high bandwidth, good noise immunity and with the ability to modify gain depending on the requirement of the base current $I_b$ based on collector-emitter voltage $V_{CE}$. The amplifier is configured to amplify the sensor output voltage $V_m$ to provide an amplifier output voltage $V_{ref}$. The regulator is connected to an amplifier output terminal and is configured to regulate a regulator output voltage $V_{cc}$ based on the amplifier output voltage $V_{ref}$. The amplifier output voltage $V_{ref}$ is used as a voltage reference for the regulator, which behaves like a buffer. The gate driver is connected to a regulator output terminal and is configured to connect/disconnect the regulator output voltage $V_{cc}$ to the base terminal of the BJT. With the regulator output voltage $V_{cc}$, the gate signals are generated internally in accordance with the amplifier output voltage $V_{ref}$. The regulator regulates the voltage of the gate driver to generate the instantaneous proportional base current $I_b$ based on the collector-emitter voltage $V_{CE}$ during the conducting state of the BJT and thereby minimizing the driver losses.

The method for optimizing the base current of the SiC BJT utilizing the gate driver circuit comprises the steps of: providing the gate driver circuit having a sensor, an amplifier, a regulator and a gate driver. Then sensing and measuring a collector-emitter voltage by the sensor based on a collector current during the conducting state of the BJT. Then providing the measured sensor voltage to the amplifier of the gate driver circuit and generating an amplifier output voltage and providing the amplifier output voltage to the regulator and generating a regulated voltage based on the collector-emitter voltage of the BJT. Then supplying the regulated voltage output of the regulator to the gate driver and optimizing the base current of the BJT based on the regulated voltage output of the regulator and the collector-emitter voltage of the BJT.

It is a first objective of the present invention to provide an advanced gate driver circuit for silicon carbide (SiC) bipolar junction transistors (BJTs) that provides a proportional base current with minimal power consumption.

A second objective of the present invention is to provide a gate driver that adjusts the base current to the instantaneous collector current by estimating the collector current by means of the collector-emitter voltage.

A third objective of the present invention is to provide a gate driver that monitors the effect of temperature on the DC current gain.

A fourth objective of the present invention is to provide a gate driver that provides a continuous supply of base current to maintain the BJT in the ON state.

Another objective of the present invention is to provide a gate driver with minimum power losses during ON state and switching that increases the efficiency of the driver.

Yet another objective of the present invention is to provide a driver that eliminates the need for the high bandwidth current sensors and the digital signal processors to process collector current of the BJT.

These and other advantages and features of the present invention are described with specificity so as to make the present invention understandable to one of ordinary skill in the art.

BRIEF DESCRIPTION OF THE DRAWINGS

Elements in the figures have not necessarily been drawn to scale in order to enhance their clarity and improve understanding of these various elements and embodiments of the invention. Furthermore, elements that are known to be common and well understood to those in the industry are not depicted in order to provide a clear view of the various embodiments of the invention, thus the drawings are generalized in form in the interest of clarity and conciseness.

DETAILED DESCRIPTION OF THE DRAWINGS

In the following discussion that addresses a number of embodiments and applications of the present invention, reference is made to the accompanying drawings that form a part hereof, and in which is shown by way of illustration specific embodiments in which the invention may be practiced. It is to be understood that other embodiments may be utilized and changes may be made without departing from the scope of the present invention.

Various inventive features are described below that can each be used independently of one another or in combination with other features. However, any single inventive feature may not address any of the problems discussed above or only address one of the problems discussed above. Further, one or more of the problems discussed above may not be fully addressed by any of the features described below.

As used herein, the singular forms "a", "an" and "the" include plural referents unless the context clearly dictates otherwise. "And" as used herein is interchangeably used with "or" unless expressly stated otherwise. As used herein, the term 'about' means +/−5% of the recited parameter. All embodiments of any aspect of the invention can be used in combination, unless the context clearly dictates otherwise.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to". Words using the singular or plural number also include the plural and singular number, respectively. Additionally, the words "herein," "wherein", "whereas", "above," and "below" and words of similar import, when used in this application, shall refer to this application as a whole and not to any particular portions of the application.

The description of embodiments of the disclosure is not intended to be exhaustive or to limit the disclosure to the precise form disclosed. While the specific embodiments of, and examples for, the disclosure are described herein for illustrative purposes, various equivalent modifications are possible within the scope of the disclosure, as those skilled in the relevant art will recognize.

Figure 1:
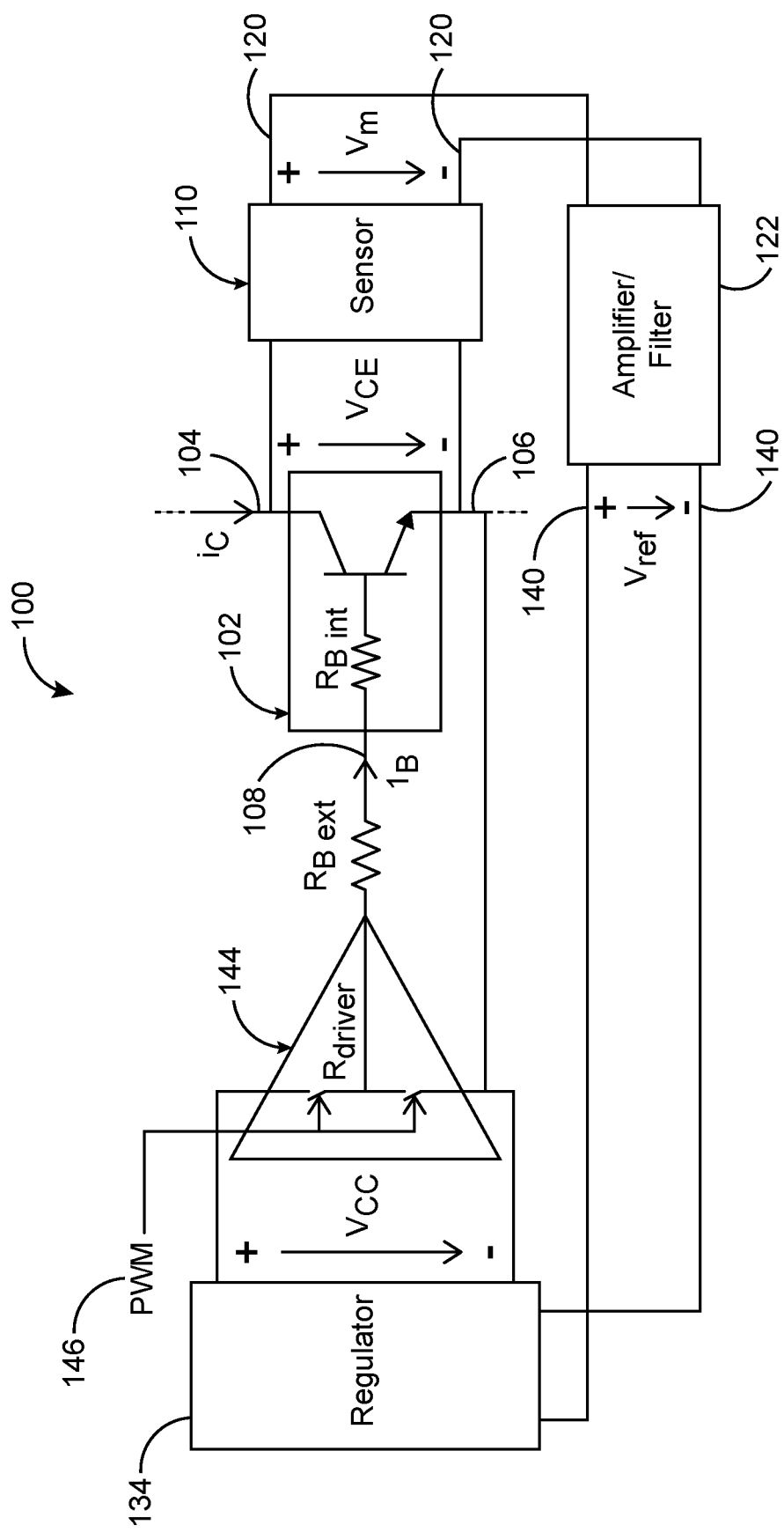
FIG. 1 illustrates a block diagram of a gate driver circuit of a silicon carbide bipolar junction transistor (SiC BJT) in accordance with the preferred embodiment of the present invention.
Figure 2:
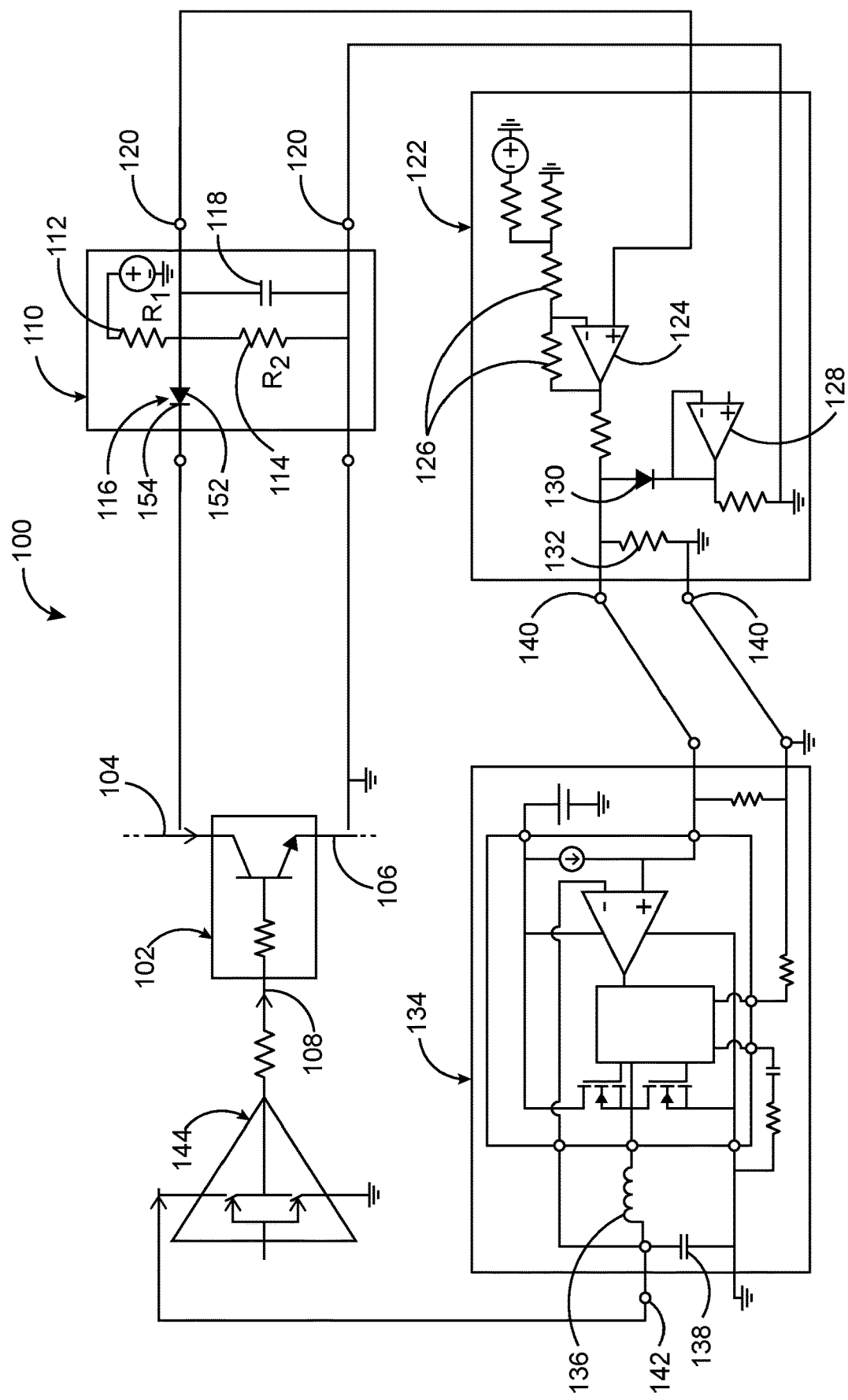
FIG. 2 illustrates a circuit diagram of the gate driver circuit of the SiC BJT in accordance with the preferred embodiment of the present invention.

Referring to FIGS. 1-2, a block diagram and a circuit diagram of a gate driver circuit 100 of a silicon carbide bipolar junction transistor (SiC BJT) 102 in accordance with the preferred embodiment of the present invention are illustrated respectively. SiC BJTs have very low specific on-resistance and offer high temperature operation due to the lack of gate oxide. This makes them very suitable for power switches and for applications with high power densities. A continuous supply of base current $I_B$ is needed to maintain the SiC BJT in the ON state. The gate driver circuit 100 of the present embodiment provides the continuous base current Is based on the collector-emitter voltage $V_{CE}$ of the SiC BJT 102. The present invention provides a proportional base current driver circuit 100 that adjusts the base current $I_b$ to the instantaneous collector current $I_C$ by estimating the collector-emitter voltage $V_{CE}$ and at the same time monitoring the effect of temperature on the DC current gain.

The collector-emitter voltage $V_{CE}$ drop across the BJT 102 during the ON state is used to estimate the collector current $I_C$, rather than measuring the current directly. Hence, the collector-emitter voltage $V_{CE}$ measurement is used to determine the required base current $I_b$ to drive the SiC BJT 102. As the operating temperature of the BJT 102 increases, the amount of t h e base current Is required for the same collector current increases, because the DC current gain decreases with temperature. Moreover, the on-resistance of SiC BJTs also increases with temperature, which for the same collector current $I_C$ results in a higher collector-emitter voltage drop. This increase in the voltage drop compensates for the decrease of the DC current gain, which offers the possibility of accomplishing temperature-sensitivity without measuring the temperature.

The gate driver circuit 100 of the present embodiment comprises a sensor 110 connected across a collector terminal 104 and an emitter terminal 106 of the BJT 102, an amplifier 122, a regulator 134 and a gate driver 144 connected to a base terminal 108 of the BJT 102. The sensor 110 is configured to sense and measure a collector-emitter voltage $V_{CE}$ across the collector terminal 104 and the emitter terminal 106 during the ON state of the BJT 102. The sensor 110 comprises a first resistor 112 and a second resistor 114 connected in series, a high voltage diode 116 with an anode 152 connected between the series connected first and second resistors 112, 114 and the cathode 154 connected to the collector terminal 104 of the BJT 102 and a first capacitor 118 connected parallel to the second resistor 114. The sensor 110 can, preferably, be a high voltage decoupling diode. In one embodiment, the sensor 110 is a Zener diode voltage clamp. The sensor 110 provides a sensor output voltage $V_m$ based on the measured collector-emitter voltage $V_{CE}$. The sensor 110 detects changes in the temperature of the BJT via its on-state resistance. The amplifier 122 is connected to a sensor output terminal 120 and is configured to amplify the sensor output voltage $V_m$. The measured values of the sensor output $V_m$ indicates that with the increase in the collector current $I_C$, the sensor output $V_m$ is also increased. Thus, the sensor output voltage $V_m$ is proportional to the collector-emitter voltage $V_{CE}$ which in turn is proportional to the collector current $I_C$ of the BJT 102 with an additional offset.

The high voltage decoupling diode 116 protects the circuitry comprising the amplifier and the regulator, from high voltage during the OFF state of the BJT 102. The sensor 110 of the present embodiment senses the collector current $I_C$ by measuring the collector-emitter voltage $V_{CE}$ and thus eliminates the need for the high bandwidth current sensors and the digital signal processors otherwise required to process collector current $I_C$.

In some other embodiments, sensors such as resistive voltage divider, Zener limiting diode and low voltage MOSFET may be used.

The amplifier 122 comprises a non-inverting operational amplifier 124 controlled by means of a plurality of resistors 126, a voltage follower 128 connected to the output of the non-inverting operational amplifier 128 by means of a first diode 130 and a third resistor 132 connected across the first diode 130 and the voltage follower 128. The amplifier 122 is selected to provide high gain, good noise immunity and with the ability to modify gain depending on the requirement of the base current Is based on collector-emitter voltage $V_{CE}$. The amplifier 122 amplifies the sensor output voltage $V_m$ to provide an amplifier output voltage $V_{ref}$. The regulator 134 is connected to an amplifier output terminal 140. The regulator 134 is configured to regulate a regulator output voltage $V_{cc}$ based on the amplifier output voltage $V_{ref}$. The regulator 134, for example, is a non-isolated synchronous buck converter. The amplifier output voltage $V_{ref}$ is used as a voltage reference for the regulator 134. The gate driver 144 is connected to a regulator output terminal 142 and is configured to connect/disconnect the regulator output voltage $V_{cc}$ to the base terminal of the BJT. With the regulator output voltage $V_{cc}$, the gate signals are generated internally in accordance with the amplifier output voltage $V_{ref}$. The regulator 134 regulates the voltage of the gate driver 144 to generate the instantaneous proportional base current Is based on the collector-emitter voltage $V_{CE}$ during the conducting state of the BJT 102 and thereby minimizing the driver losses.

The power losses during the conduction state of the BJT 102 are determined by the collector current $I_C$ and the On-resistance. The power losses generated in the gate driver 144 can be calculated with base current $I_B$, the base-emitter saturation voltage ($V_{BE(sat)}$), the internal base resistance ($R_{Bint}$), the external base resistance ($R_{Bext}$) and the driver resistance ($R_{driver}$).

A Pulse width modulated (PWM) signal 146 is used for controlling the gate driver 144 output. The regulator 134 provides voltage supply to the gate driver 144 to provide the continuous supply of base current Is to maintain the BJT 102 in ON state with minimal conduction losses. The regulator 134, for example, can be an integrated circuit (IC) with a synchronous buck converter inside (LTC3600). Thus, the gate driver circuit 100 of the present invention optimizes the base current $I_B$ based on the collector-emitter voltage $V_{CE}$ by adjusting the voltage applied to the gate driver 144 by the regulator 134. The output voltage of the regulator 134 is controlled by an inductor 136 and a capacitor 138 connected to the regulator output terminal 142. The gate driver 144 output voltage is adjusted during the conducting state of the BJT 102. Thus, the operation of the present invention includes the flow of collector current $I_C$ through the BJT that results in a voltage drop across the collector-emitter terminals $V_{CE}$, which is measured by the sensor 110. The output of the sensor $V_m$ is conditioned with the amplifier 122 that generates the amplifier output $V_{ref}$ for the regulator 134. The regulator 134 buffers the amplifier output $V_{ref}$ to output the voltage $V_{cc}$ that causes the gate driver 144 to generate the required base current Is to flow through the BJT 102 to keep it in ON state. Output voltage of the regulator 134 is dependent on the temperature of the SiC BJT 102. The gate driver 144 optimizes the base current by monitoring the effect of temperature on the DC current gain of the BJT.

Figure 3:
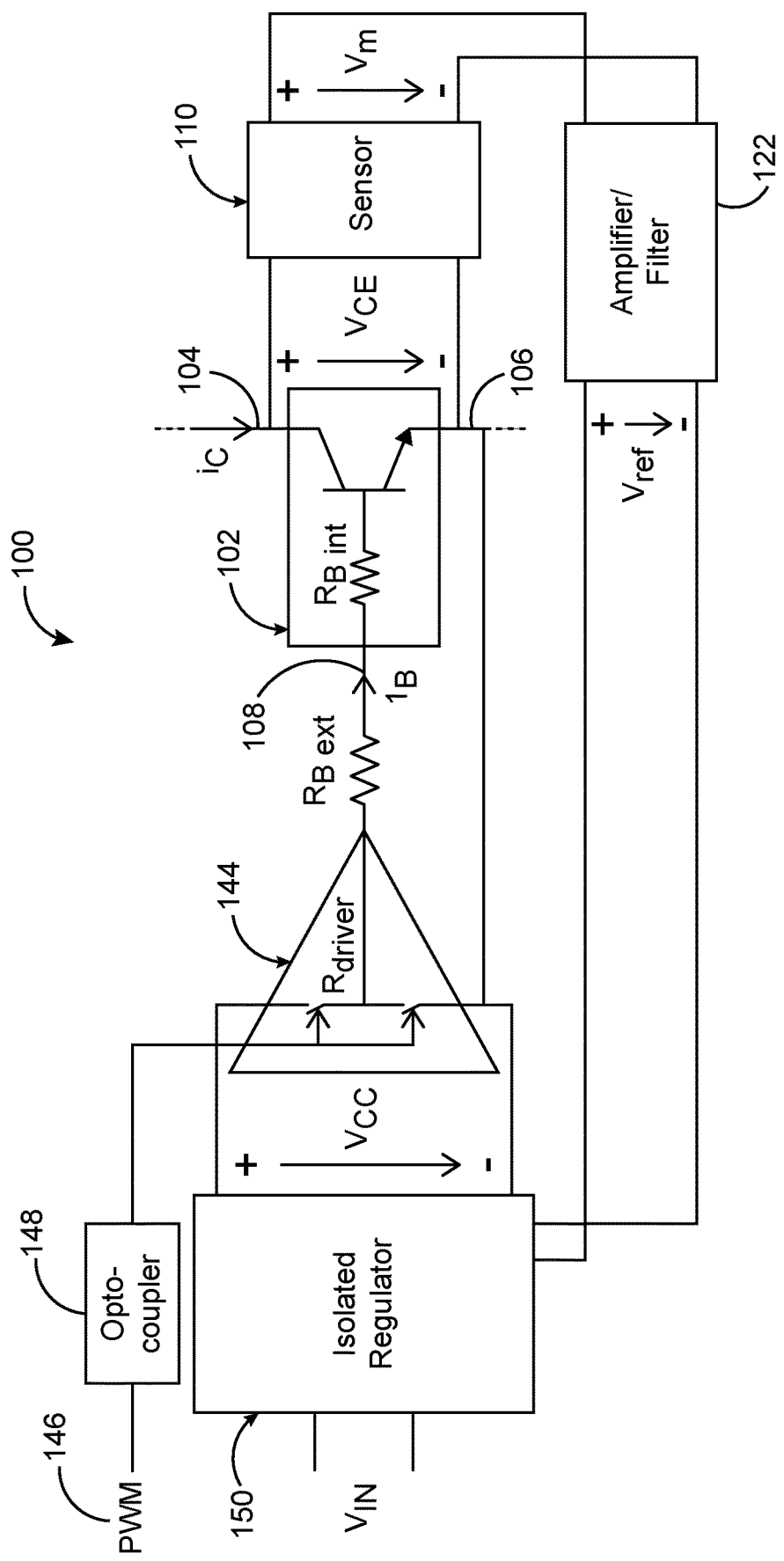
FIG. 3 illustrates a block diagram of the gate driver circuit of the SiC BJT in accordance with one embodiment of the present invention.

FIG. 3 illustrates a block diagram of the gate driver circuit 100 of the SiC BJT 102 employing an isolated regulator 150. In this embodiment of the present invention, an isolated regulator topology is utilized. The collector-emitter voltage $V_{CE}$ of the BJT 102 is measured by the sensor 110 and provided to the amplifier 122 which amplifies the sensor output voltage as illustrated in FIG. 1. In this embodiment, the amplified amplifier output voltage is then applied to the isolated regulator 150. The isolated regulator 150 of this embodiment is based on Flyback, Push-Pull, Half/full-Bridge, etc. The isolated regulator 150 is combined with an opto-coupler 148, digital isolator or pulse transformer, for the PWM 146 signal. This embodiment illustrates the gate driver circuit with the isolated regulator for a universal high/low side driver.

Figure 4:
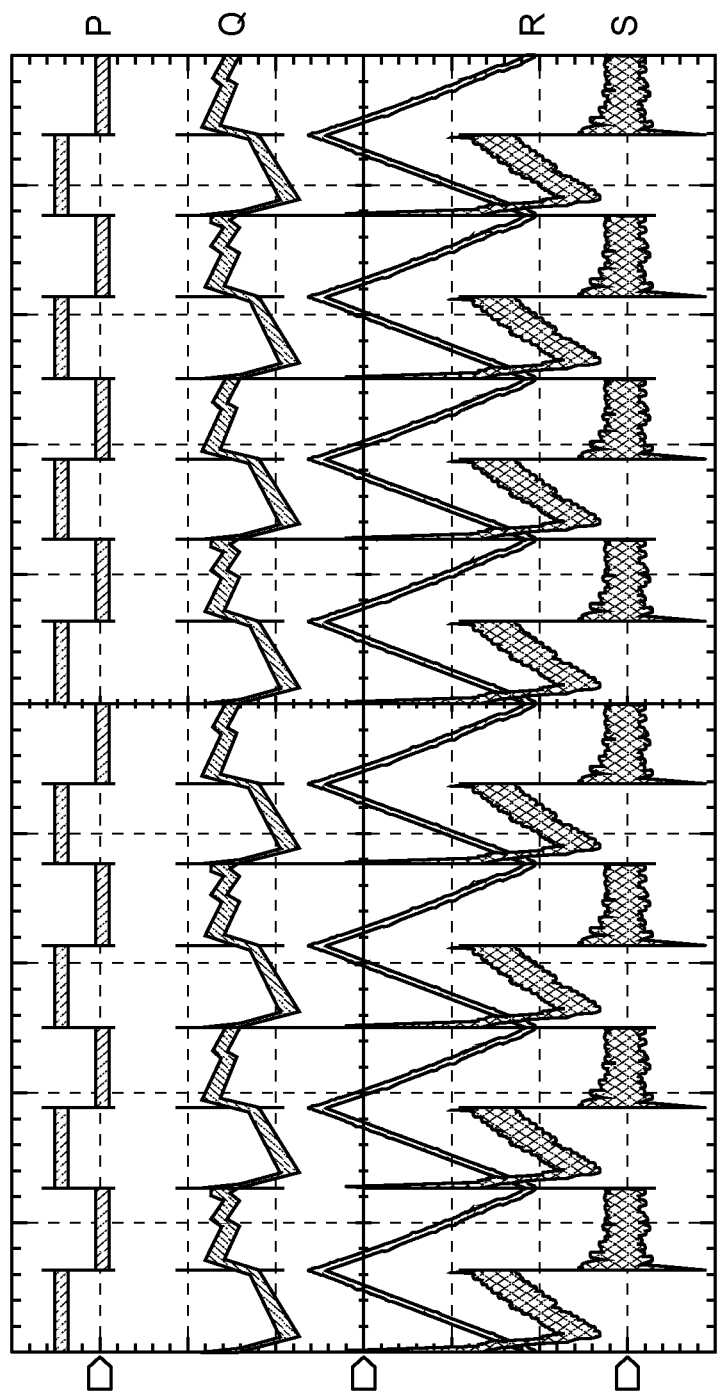
FIG. 4 illustrates a graph illustrating the waveforms generated at different stages of the gate driver circuit of the SiC BJT in accordance with an exemplary embodiment of the present invention.

FIG. 4 illustrates a graph illustrating the waveforms generated at different stages of the gate driver circuit 100 of the SiC BJT 102 in accordance with an exemplary embodiment of the present invention. The graphs summarize experimental results of the gate driver circuit 100 of the present embodiment used to control the SiC BJT 102. In the example illustrated in FIG. 4, a Boost converter at room temperature for an output power of 1.6 kW is utilized. The pulse width modulated (PWM) control signal 146 for the SiC BJT 102 is shown as waveform P. The waveform of the regulator output voltage $V_{cc}$ and the regulator output current $I_L$ through the inductor 136 is illustrated by Q and R respectively. The continuous base current $I_B$ proportional to the regulator output voltage $V_{cc}$ is shown by the waveform S.

Figure 5:
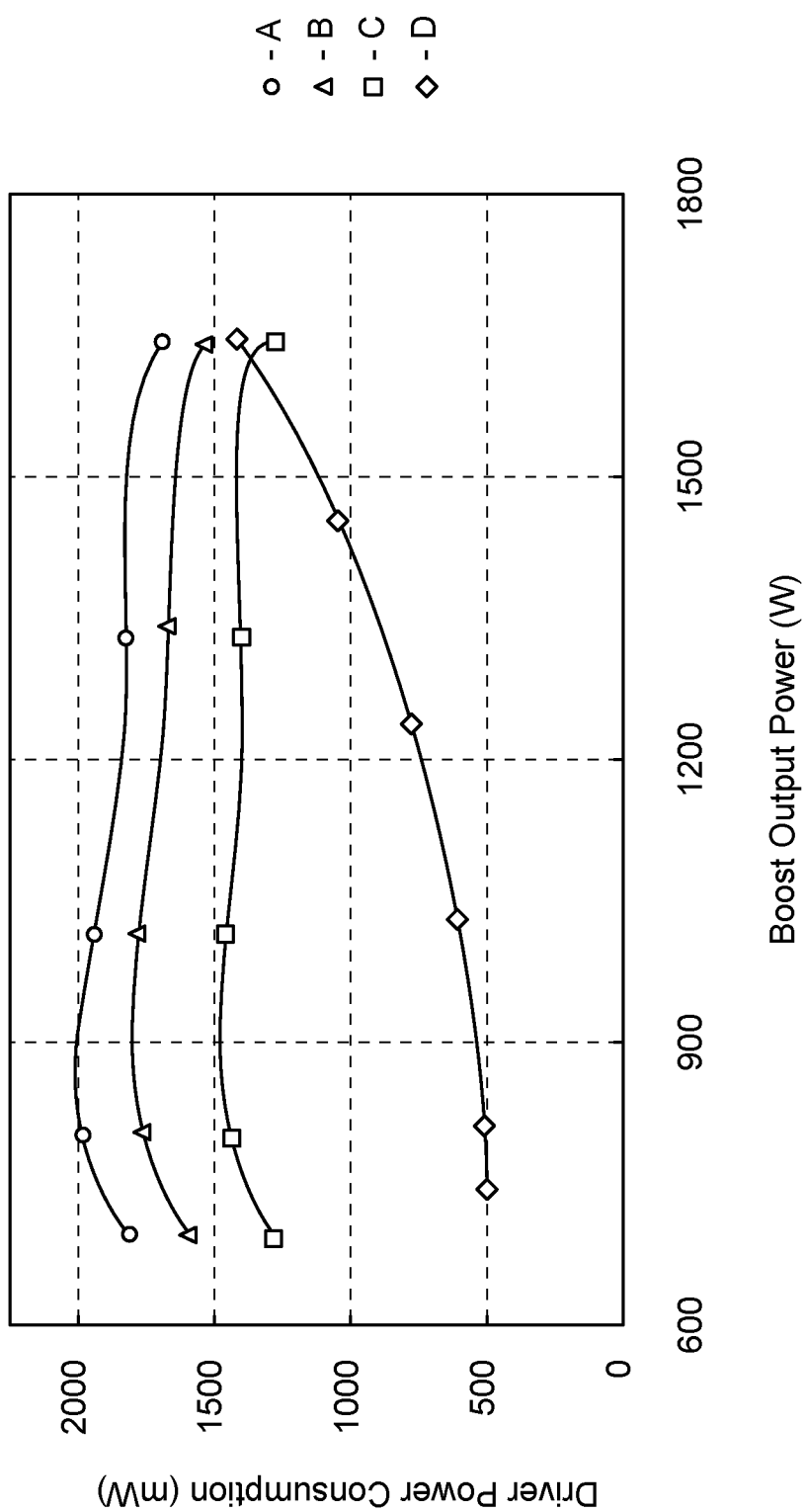
FIG. 5 illustrates graphs that show the reduction of the driver power consumption with respect to the output power of the converter of the present gate driver circuit and different existing gate drivers in accordance with the exemplary embodiment of the present invention.

FIG. 5 illustrates graphs depicting the driver power consumption with respect to the output power of the converter of the present gate driver circuit 100 and an existing gate driver in accordance with the exemplary embodiment of the present invention. A Boost converter was utilized for this purpose. Experiments were carried out on the existing gate driver and the gate driver circuit 100 of the present invention at room temperature. Graphs were calibrated at different output power of the Boost converter. Graphs A, B and C show the variation of the driver power consumption with respect to the output power of the Boost converter of the existing gate driver for different values of external base resistance. Graph D shows the variation of the driver power consumption with respect to the output power of the Boost converter of the gate driver circuit 100 of the present embodiment. The graphs reveal that the gate driver circuit 100 of the present embodiment reduced the driver power consumption by a factor of 4 compared to the existing gate driver.

The reduction of the driver power consumption offered by embodiments of this invention is more noticeable in converters where the inductor current ripple is large (e.g., converters operated in Discontinuous Conduction Mode or Resonant Converters) and converters in applications where the operating temperature of the SiC BJT is expected to fluctuate within a large temperature window.

Thus, the present invention 100 provides the proportional base current Is based on the collector-emitter voltage $V_{CE}$ and eliminates high bandwidth current sensors and microcontrollers. Embodiments of this invention also provide a standalone gate driver circuit that replaces other switch and driver combinations using IGBTs or MOSFETs, without any modifications at the converter level.

Figure 6:
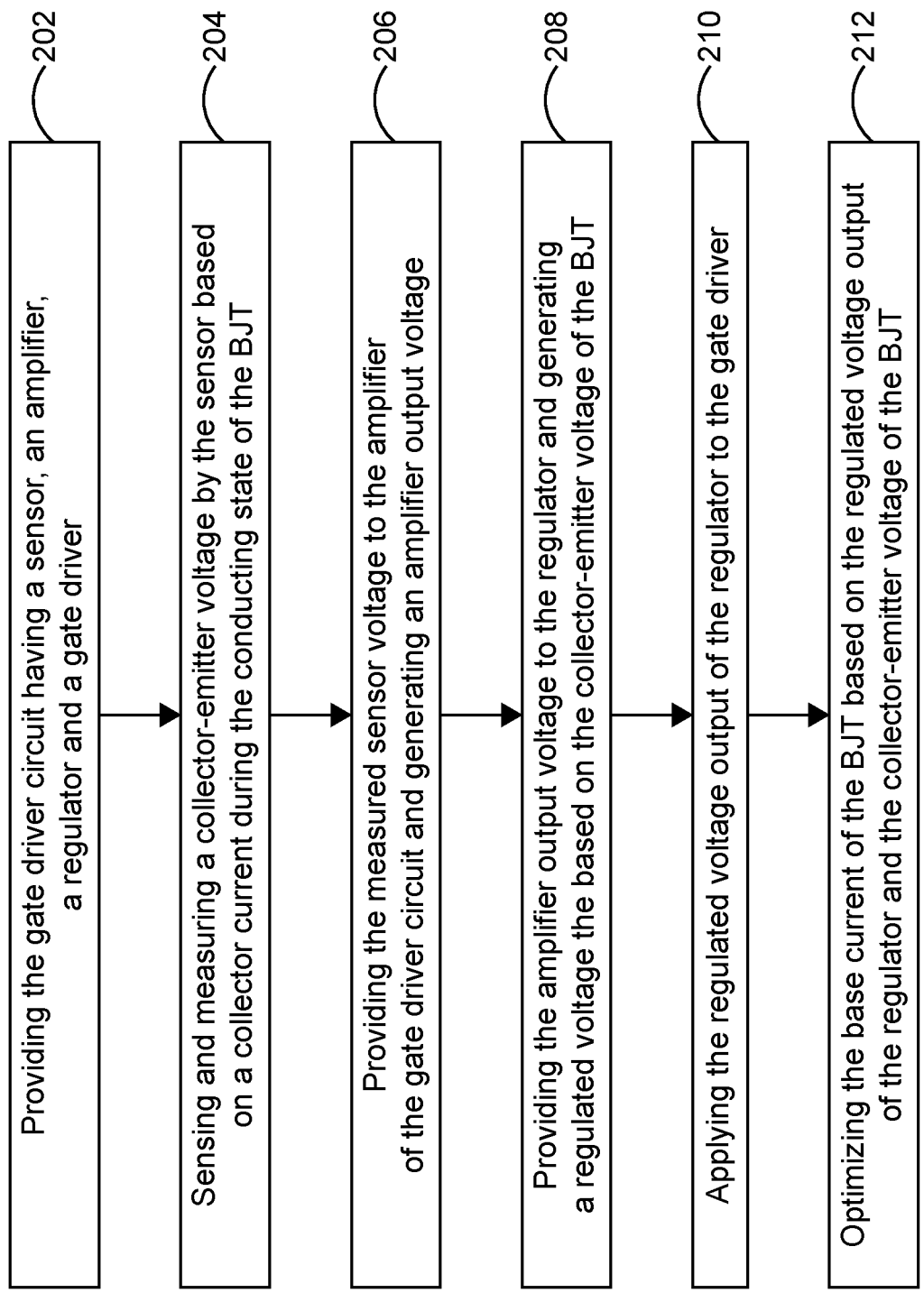
FIG. 6 illustrates a flowchart of a method for optimizing the base current of the SiC BJT utilizing the gate driver circuit in accordance with the preferred embodiment of the present invention.

FIG. 6 illustrates a flowchart of a method for optimizing the base current of the SiC BJT utilizing the gate driver circuit in accordance with the preferred embodiment of the present invention. The method comprises the steps of: providing the gate driver circuit having a sensor, an amplifier, a regulator and a gate driver as indicated in block 202. Sensing and measuring a collector-emitter voltage by the sensor based on a collector current during the conducting state of the BJT as indicated in block 204. As indicated in block 206, providing the measured sensor voltage to the amplifier of the gate driver circuit and generating an amplifier output voltage and providing the amplifier output voltage to the regulator and generating a regulated voltage based on the collector-emitter voltage of the BJT as indicated in block 208. Applying the regulated voltage output of the regulator to the gate driver as indicated in block 210 and optimizing the base current of the BJT based on the regulated voltage output of the regulator and the collector-emitter voltage of the BJT as indicated in block 212.

The present invention provides a novel design of the gate driver circuit 100 with minimal power consumption, adjusts the base current Is to the instantaneous collector current $I_C$ by adjusting the driver voltage supply $V_{cc}$, based on the effect of temperature on the DC current gain. The driver circuit 100 of the present embodiment can be implemented in any power electronics converter topology including DC/DC converters, inverters etc.

Embodiments of this invention also provide a standalone driver circuit that can replace other switch plus driver combinations using IGBTs or MOSFETs, without any modifications at the converter level.

The foregoing description of the preferred embodiment of the present invention has been presented for the purpose of illustration and description. It is not intended to be exhaustive or to limit the invention to the precise form disclosed. Many modifications and variations are possible in light of the above teachings. It is intended that the scope of the present invention not be limited by this detailed description, but by the claims and the equivalents to the claims appended hereto.

What is claimed is:

1. A gate driver circuit, comprising:
   a sensor connected between a collector terminal and an emitter terminal of a bipolar junction transistor (BJT), the sensor configured to sense and measure a collector-emitter voltage $V_{CE}$;
   a regulator connected to an amplifier having an amplifier output voltage and configured to regulate a regulator output voltage based on the amplifier output voltage; and a gate driver connected to a regulator output terminal of the regulator and configured to connect/disconnect the regulator output voltage to a base terminal of the BJT;

wherein the output voltage of the regulator is controlled by an inductor and a capacitor connected at the regulator output terminal.

2. The gate driver circuit of claim 1 wherein the sensor comprises a first resistor and a second resistor connected in series, a high voltage diode with an anode connected between the series connected first and second resistors and the cathode connected to the collector terminal of the BJT and a first capacitor connected parallel to the second resistor.

3. The gate driver circuit of claim 1 wherein the amplifier comprises a non-inverting operational amplifier controlled by means of a plurality of resistors, a voltage follower connected to an output terminal of the non-inverting operational amplifier by means of a first diode and a third resistor connected across the voltage follower and the first diode configured to provide the output of the amplifier.

4. The gate driver circuit of claim 1 wherein the output voltage of the regulator is controlled by an inductor and a capacitor connected at a regulator output terminal.

5. The gate driver circuit of claim 1 wherein the sensor is a high voltage decoupling diode.

6. The gate driver circuit of claim 1 wherein the sensor is a Zener diode voltage clamp.

7. The gate driver circuit of claim 1 wherein the sensor is configured to measure the collector-emitter voltage $V_{CE}$ during the ON state of the BJT.

8. The gate driver circuit of claim 1 wherein a high voltage decoupling diode protects the circuitry comprising the amplifier and the regulator, from high voltage during the OFF state of the BJT.

9. The gate driver circuit of claim 1 wherein the sensor output voltage is proportional to the collector current of the BJT with an additional offset.

10. The gate driver circuit of claim 1 wherein the amplifier output is used as a voltage reference to the regulator.

11. The gate driver circuit of claim 1 wherein the regulator is a synchronous buck converter.

12. The gate driver circuit of claim 1 wherein the regulator provides voltage to the gate driver to provide a continuous supply of base current to maintain the BJT in ON state with minimal conduction losses.

13. The gate driver circuit of claim 12 wherein the gate driver optimizes the base current based on the collector-emitter voltage by adjusting the supply voltage of the gate driver thereby minimizing the power consumption.

14. The gate driver circuit of claim 12 wherein the gate driver output voltage is adjusted during the conducting state of the BJT.

15. The gate driver circuit of claim 12 wherein the gate driver optimizes the base current by monitoring the effect of temperature on the DC current gain.

16. A gate driver circuit for a Silicon Carbide Bipolar Junction Transistor (SiC BJT), comprising:

a sensor connected between a collector terminal and an emitter terminal of the SiC BJT and configured to sense and measure a collector-emitter voltage $V_{CE}$, the sensor having a first resistor and a second resistor connected in series, a high voltage diode with an anode connected between the series connected first and second resistors and the cathode connected to the collector terminal of the SiC BJT and a first capacitor connected parallel to the second resistor;

a regulator connected to an amplifier having an amplifier voltage and configured to regulate a regulator output voltage based on the amplifier voltage; and a gate driver connected to the regulator output terminal of the regulator and configured to provide an instantaneous base current based on the collector-emitter voltage of the SiC BJT;

whereby the regulator regulates the voltage of the gate driver to generate the instantaneous proportional base current based on the collector-emitter voltage and monitor the effect of temperature on the DC current gain during the conducting state of the SiC BJT thereby minimizing the driver losses.

* * * * *